(12) United States Patent
Park et al.

(10) Patent No.: US 7,947,549 B2
(45) Date of Patent: May 24, 2011

(54) GATE EFFECTIVE-WORKFUNCTION MODIFICATION FOR CMOS

(75) Inventors: Dae-Gyu Park, Poughquaq, NY (US); Michael P Chudzik, Danbury, CT (US); Rashmi Jha, Beacon, NY (US); Siddarth A Krishnan, Peekskill, NY (US); Naim Moumen, Walden, NY (US); Vijay Narayanan, New York, NY (US); Vamsi Paruchuri, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 319 days.

(21) Appl. No.: 12/037,158

(22) Filed: Feb. 26, 2008

(65) Prior Publication Data

US 2009/0212369 A1     Aug. 27, 2009

(51) Int. Cl.
    *H01L 21/8238* (2006.01)
(52) U.S. Cl. .. 438/216; 438/199; 257/369; 257/E21.632
(58) Field of Classification Search .................. 257/368; 438/199, 216
    See application file for complete search history.

(56) References Cited

U.S. PATENT DOCUMENTS

| 7,105,889 | B2 | 9/2006 | Bojarczuk | 257/324 |
|---|---|---|---|---|
| 7,242,055 | B2 | 7/2007 | Bojarczuk | 257/324 |
| 2002/0142262 | A1 | 10/2002 | Hippensteel | 433/88 |
| 2004/0126944 | A1 | 7/2004 | Pacheco Rotondaro | 438/197 |
| 2004/0161883 | A1 | 8/2004 | Colombo | 438/197 |
| 2004/0238904 | A1 | 12/2004 | Colombo | 257/410 |
| 2006/0030096 | A1* | 2/2006 | Weimer | 438/199 |
| 2006/0081948 | A1 | 4/2006 | Lim | 257/410 |
| 2008/0237604 | A1* | 10/2008 | Alshareef et al. | 257/69 |
| 2009/0152636 | A1* | 6/2009 | Chudzik et al. | 257/369 |
| 2010/0041223 | A1* | 2/2010 | Chen et al. | 438/591 |
| 2010/0133623 | A1* | 6/2010 | Inumiya et al. | 257/369 |

OTHER PUBLICATIONS

U.S. Appl. No. 11/745,994, filed May 8, 2007, Doris.
Aboaf, IBM-TDB; V.12; N.11; p. 1836; Apr. 1970.
Balk, IBM-TBD; V.12; N.11; p. 1858; Apr. 1970.
Kalter, IBM-TBD; V.14; N.10; p. 3179; Mar. 1972.

* cited by examiner

*Primary Examiner* — Marcos D. Pizarro
*Assistant Examiner* — Eva Yan Montalvo
(74) *Attorney, Agent, or Firm* — George Sai-Halasz; Louis J. Percello

(57) ABSTRACT

CMOS circuit structures are disclosed with the PFET and NFET devices having high-k dielectric layers consisting of the same gate insulator material, and metal gate layers consisting of the same gate metal material. The PFET device has a "p" interface control layer which is capable of shifting the effective-workfunction of the gate in the p-direction. In a representative embodiment of the invention the "p" interface control layer is aluminum oxide. The NFET device may have an "n" interface control layer. The materials of the "p" and "n" interface control layers are differing materials. The "p" and "n" interface control layers are positioned to the opposite sides of their corresponding high-k dielectric layers. Methods for fabricating the CMOS circuit structures with the oppositely positioned "p" and "n" interface control layers are also disclosed.

7 Claims, 5 Drawing Sheets

US 7,947,549 B2

GATE EFFECTIVE-WORKFUNCTION MODIFICATION FOR CMOS

FIELD OF THE INVENTION

The present invention relates to high performance electronic circuits. In particular, it relates to FET devices having high-k containing gate dielectrics, and metal containing gates.

BACKGROUND OF THE INVENTION

Today's integrated circuits include a vast number of devices. Smaller devices and shrinking ground rules are the key to enhance performance and to reduce cost. As FET (Field-Effect-Transistor) devices are being scaled down, the technology becomes more complex, and changes in device structures and new fabrication methods are needed to maintain the expected performance enhancement from one generation of devices to the next. The mainstay material of microelectronics is silicon (Si), or more broadly, Si based materials. One such Si based material of importance for microelectronics is the silicon-germanium (SiGe) alloy. The devices in the embodiments of the present disclosure are typically part of the art of single crystal Si based material device technology.

There is great difficulty in maintaining performance improvements in devices of deeply submicron generations. Therefore, methods for improving performance without scaling down dimensions have become of interest. There is a promising avenue toward higher gate capacitance without having to make the gate dielectric actually thinner. This approach involves the use of so called high-k materials. The dielectric constant of such materials is significantly higher than that of $SiO_2$, which is about 3.9. A high-k material may physically be significantly thicker than an oxide, and still have a lower equivalent oxide thickness (EOT) value. The EOT, a concept known in the art, refers to the thickness of such an $SiO_2$ layer which has the same capacitance per unit area as the insulator layer in question. In today state of the art FET devices, one is aiming at an EOT of below 2 nm, and preferably below 1 nm.

Device performance is also enhanced by the use of metal gates. The depletion region in the poly-Si next to the gate insulator can become an obstacle in increasing gate-to-channel capacitance. The solution is to use a metal gate. Metal gates also assure good conductivity along the width direction of the devices, reducing possible RC delays in the gate.

High performance small FET devices are in need of precise threshold voltage control. As operating voltage decreases, to 2V and lower, threshold voltages also have to decrease, and threshold variation becomes less tolerable. Every new element, such as a different gate dielectric, or a different gate material, influences the threshold voltage. Sometimes such influences are detrimental for achieving the desired threshold voltage values. Any technique which can affect the threshold voltage, without other effects on the devices is a useful one.

Specific layers of threshold modifying materials, so called interface control layers (ICL), have been introduced into n-type FET gate insulators for the purpose of favorably adjusting the effective-workfunction of the gate. However, hitherto the shifting of the effective-workfunction of the gate in the p-direction by modifying the gate insulator has not been achieved for FET devices, or for CMOS circuits.

SUMMARY OF THE INVENTION

In view of the discussed difficulties, embodiments of the present invention disclose a CMOS circuit which has: A first type device, which first type device includes a first type channel hosted in a Si based material, and a first gate stack overlapping the first type channel. The first gate stack includes a first gate layer of a gate metal material, and further includes a first gate insulator in-between the first gate stack and the first type channel. The first gate insulator includes at least two layers: a first dielectric layer of a high-k insulator material and a first interfacial control layer. The first dielectric layer is in-between and in direct contact with the first gate layer and with the first interfacial control layer. The CMOS circuit further has: A second type device, which second type device includes a second type channel hosted in the Si based material, and a second gate stack overlapping the second type channel. The second gate stack includes a second gate layer of the same gate metal material as the first gate stack. The second type device further includes a second gate insulator in-between the second gate stack and the second type channel. The second gate insulator includes a second dielectric layer of the same high-k insulator material as the first dielectric layer. If the second gate insulator further includes a second interfacial control layer, then this second interfacial control layer is in-between and in direct contact with the second gate layer and the second dielectric layer. The second interfacial control layer would be of a different material than the first interfacial control layer.

Embodiments of the invention further disclose a method for shifting an FET device threshold in the direction of positive voltage. The method involves building into the gate insulator a between about 0.1 nm and about 1.5 nm thick interfacial control layer.

BRIEF DESCRIPTION OF THE DRAWINGS

These and other features of the present invention will become apparent from the accompanying detailed description and drawings, wherein.

DETAILED DESCRIPTION OF THE INVENTION

Figure 1A:
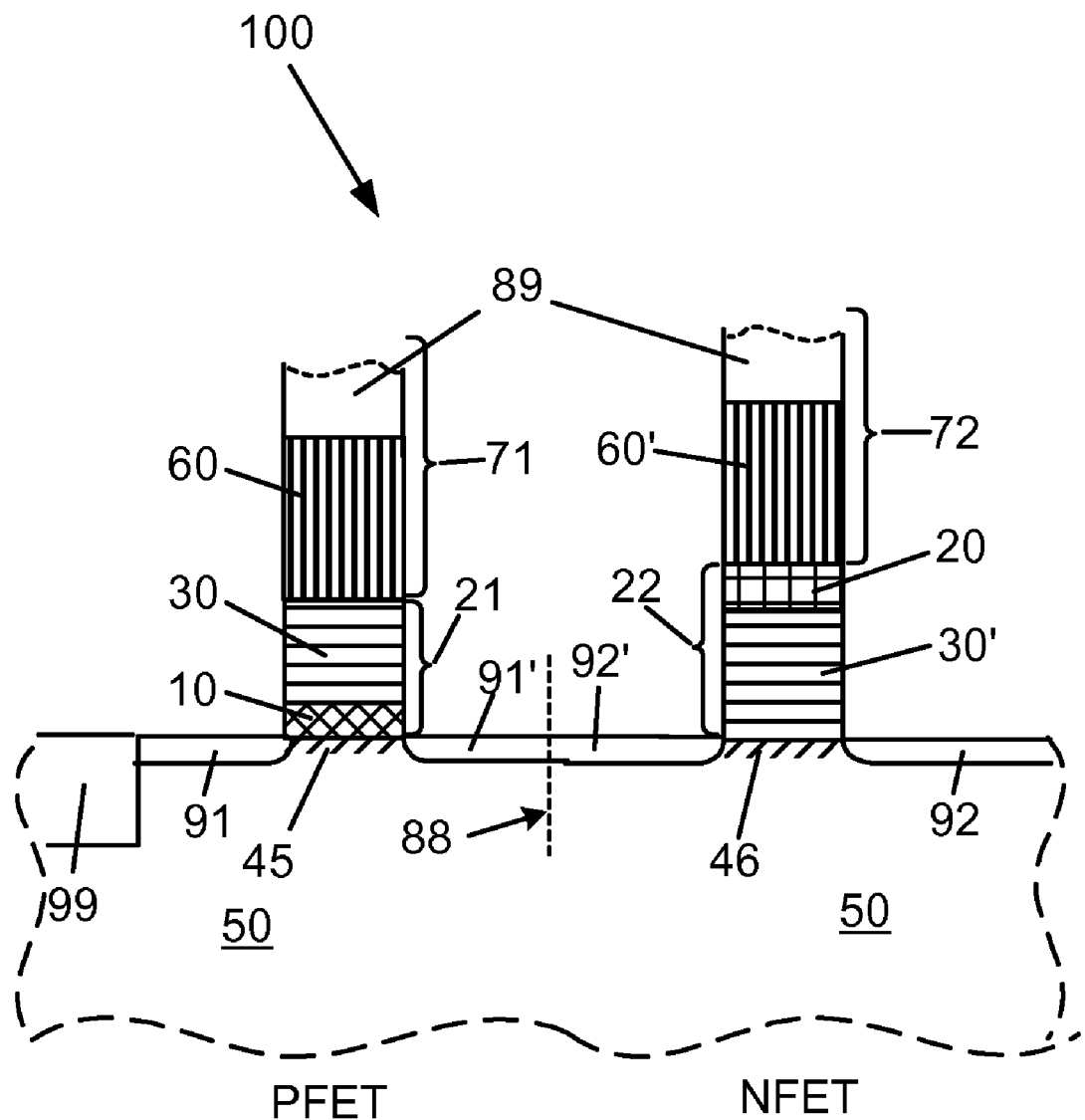
FIG. 1A shows a schematic cross section of a CMOS circuit structure according to an embodiment of the present invention, which includes interfacial control layers.

It is understood that Field Effect Transistor-s (FET) are well known in the electronic arts. Standard components of a FET are the source, the drain, the body in-between the source and the drain, and the gate. The body is usually part of a substrate, and it is often called substrate. The gate is overlaying the body and is capable to induce a conducting channel in the body between the source and the drain. In the usual nomenclature, the channel is hosted by the body. The gate is separated from the body by the gate insulator, or dielectric. The FET source and drain are often referred to simply as electrodes. The electrodes adjoin the induced conductive channel and are capable of being in electrical continuity with the induced conductive channel. There are two type of FET devices: a hole conduction type, called PFET, and an electron conduction type, called NFET. Often, but not exclusively, PFET and NFET devices are wired into CMOS circuits.

In FET operation an inherent electrical attribute is the threshold voltage. When the voltage between the source and the gate exceeds the threshold voltage, the FETs are capable to carry current between the source and the drain. Since the threshold is a voltage difference between the source and the gate of the device, in general, NFET threshold voltages are positive, and PFET threshold voltages are negative.

As FET devices are scaled to smaller size, the traditional way of setting threshold voltage, namely by adjusting body and channel doping, loses effectiveness. The effective-workfunction of the gate material, and the gate insulator properties are becoming important factors in determining the thresholds of small FETs. Such, so called small FETs have typically gate lengths, or gate stack lengths, of less than 50 nm, and operate in the range of less than about 1.5 V. The gate stack length, or gate length, is defined in the direction of the device current flow between the source and the drain. For small FETs the technology is progressing toward the use of metallic gates and high-k dielectrics for gate insulators. However, the optimal combination from a performance, or processing, point of view of a particular metal gate, and a particular high-k dielectric in the gate insulator, might not lead to optimal threshold values for both NFET and PFET devices.

In small devices with low EOT gate insulators, the workfunction of the gate may significantly influence the threshold voltage. In the general terminology of the art, one characterizes the workfunction of the gate in relation to the Si energy gap. For instance, in the art the term "band-edge workfunction" means that the gate has a workfunction like that of $n^+$, or $p^+$ Si. Similarly, "mid-gap", or "quarter-gap" workfunction mean a gate appearing to have a workfunction roughly like intrinsic silicon, or one halfway between intrinsic Si and heavily doped Si. All other things being equal, with only the gate workfunction changing, the threshold difference for a small device is about 0.5 V for a gate workfunction going from band-edge value to mid-gap value.

When a metal gate, such as for instance TiN, is used in conjunction with a high-k gate dielectric, such as, for instance, $HfO_2$, often the threshold corresponds to an effective-workfunction that is not too far from mid-gap. Such a threshold value may not be optimal, and further threshold adjusting schemes may have to be introduced.

The gate insulator may also influence the device threshold. Various dielectric materials in the gate insulators, or various processing treatments of the gate insulator may change the device threshold. The gate insulator in such cases acts as if one were to modify the workfunction of the gate. One may say that the gate dielectric can create an effective-workfunction for the gate, preferably modifying this effective-workfunction toward desired values.

It was already studied and observed that a layer of a threshold modifying material, a so called interfacial control layer, in direct contact with the high-k material, such as an $HfO_2$ dielectric, and with using appropriate processing treatments, can shift the effective-workfunction of the metal gate. A metal-oxide compound interfacial control layer, where the metals are coming from the Group IIA and IIIB columns of the periodic table, can shift the effective-workfunction of the metal gate, such as TiN, in the n-direction. The terms "n-direction", or "p-direction", mean that the threshold of the device shifts in a way as if the gate workfunction were to move toward the values of $n^+$, or $p^+$ Si. In general, the n-direction means that the threshold shifts in the direction of negative voltage, for instance from 0.5 V to 0.2 V. While p-direction means that the threshold shifts in the direction of positive voltage, for instance from −0.5 V to −0.2 V. Examples of such n-direction, or "n" interfacial control layers (NICL) may be $La_2O_3$, MgO, BaO, and several other oxides. The effect of such NICL has been already reported in the art, for instance by V. Narayanan et al. in "IEEE VLSI Symposium", p. 224, (2006), and by Guha et al. in Appl. Phys. Lett. 90, 092902 (2007).

If in the processing of CMOS circuit chips one could use the same gate metal material for both type of FET devices, it would lead to a greatly simplified fabrication process relative to the one using differing metals for the differing device types. Being able to use the same high-k dielectric material in the gate insulators, as well, would further improve the simplicity of fabrication. Simplicity in a process means cost savings, both because of the fewer steps in the process, and due to a presumably higher yield. Finding a way to be able to shift a device threshold in the p-direction by modifying the gate insulator, similarly as a NICL achieves for the n-direction, and integrating such an approach into the CMOS circuit fabrication process, would allow to use only one gate metal material and one high-k material for both type of devices.

Embodiments of the present invention introduce a "p" interfacial control layer (PICL). With the PICL desired threshold values may be achieved for the PFET, while as known, an NICL may do the same for the NFET. In embodiments of the present invention the gate metal layers for both type of devices are fabricated from a uniformly deposited common layer. In this manner large number of masking and processing steps are saved, in comparison with the usual procedures in the art, where the fabrication of the two type of devices is not compatible, and while processing one of the device types the other type has to be masked. Furthermore, in representative embodiments of the present invention the high-k material of the gate insulator is also commonly processed for both type of devices using a single blanket dielectric layer.

FIG. 1A shows a schematic cross section of a CMOS circuit structure according to an embodiment 100 of the present invention including interfacial control layers. It is understood that in addition to the elements of the embodiments of the invention the figures show several other elements, since they are standard components of FET devices. The device bodies 50 are of a Si based, or possibly of a compound semiconductor material, typically of single crystal. In a representative embodiment of the invention the Si based material bodies 50 are essentially Si. In exemplary embodiments of the invention the device bodies 50 are part of a substrate. The substrate may be any type known in the electronic art, such as, without the intent of limitation: bulk, or semiconductor on insulator (SOI), fully depleted, or partially depleted, FIN type, or any other kind. Also, substrates may have various wells of various conductivity types, in various nested positioning enclosing device bodies.

The figure shows what typically may be only a small fraction of an electronic chip, for instance a processor, as indicated by the wavy dashed line boundaries. The schematic representation of FIG. 1A, as well as of all other figures, implies no real size relationships between the various depicted elements.

The devices may be isolated from one another by any method known in the art. The figure shows a shallow trench 99 isolation scheme, as this is a typical advanced isolation technique available in the art. A p-type channel 45 is hosted in the body, or substrate 50, and a PFET gate stack 71 overlaps the p-type channel 45. A PFET gate insulator 21 is in-between the PFET gate stack 71 the and the p-type channel 45.

The PFET gate insulator 21 has two layers, a PFET dielectric layer 30 of a high-k insulator material and a "p" interfacial control layer 10. The embodiment depicted in FIG. 1A has the PICL 10 next to the p-type channel, and the PFET dielectric layer 30 next to a PFET gate layer 60. Accordingly, the arrangement of the FIG. 1A embodiment is such that the PFET dielectric layer 30 is in-between the PFET gate layer 60 and the PICL 10, and it is in direct physical contact with both. The PICL 10 may be in direct physical contact with the p-channel 45, or there may be a very thin interlaying film, not shown in FIG. 1A. Such a very thin film may be of oxide, which under fabrication conditions may even be difficult to avoid in the form of a native oxide. However, the presence of, or the lack of, any such additional film between the PICL 10, and the p-channel 45 is of no consequence regarding embodiments of the present invention.

In embodiments of the present invention the PICL is less than about 1.5 nm thick, typically in the range of between about 0.1 nm and about 1 nm. In exemplary embodiments of the invention the PICL 10 may be an aluminum oxide ($Al_2O_3$) layer, or an aluminum nitride (AlN) layer. The PICL 10 is the component which is purposefully introduced into the PFET gate insulator 21, in a layered configuration with the PFET dielectric layer 30, in order to shift the PFET threshold in the p-direction. Hitherto no "p" interfacial control layer was know in the art, the kind which would have been able to shift the PFET device threshold toward the desired, more positive, direction. Although aluminum oxide and aluminum nitride are well known materials in the electronic fabrication arts, it was not known that a thin layer of these material can have such an influence on the effective-workfunction of a metal gate.

The stoichiometric chemical composition of bulk aluminum oxide is $Al_2O_3$. However, in advanced technologies, such as the PICL, one is dealing with layers as thin as 1 nm, or even less. In thin layers, due to interfacial effects and possible intermixing between various layers, the average composition of any given layer may not match exactly its supposed bulk, stoichiometric, composition. Therefore, in case of the PICL 10 aluminum oxide it is understood that one might think of the average composition as $AlO_x$, with "x" as the oxygen to aluminum ratio, being close to, but not necessarily exactly 1.5, as it would be in a bulk sample of aluminum oxide. With the same reasoning, for a PICL 10 of AlN, it is understood that it might actually be $AlN_y$.

The PFET dielectric layer 30 is of a high-k insulator material. As know in the art, such a high-k insulator material may be $ZrO_2$, $HfO_2$, HfSiO, HfSiON, and/or their admixtures. In exemplary embodiments of the present invention the high-k insulator material is selected to be $HfO_2$.

The PFET gate layer 60 is of a gate metal material. Examples of such a gate metal material, as known in the art, and without intent of limiting, include TiN, W, Mo, Mn, Ta, TaN, TaC, TaAlN, TiAlN, WN, Ru, Cr, Ta, Nb, V, Mn, Re, and their admixtures. In exemplary embodiments of the present invention the gate metal material is selected to be TiN.

The PFET gate layer 60 is part of a PFET gate stack 71. The PFET gate stack 71 may also contain various additional conductive layers 89, such as, for instance, polycrystalline and/or amorphous Si, SiGe, silicided layers, and others as known in the art. However, the nature of possible additional layers covering the PFET gate layer 60 are of no particular interest for the embodiments of the present invention, and are lumped together under the single indicator number 89, with the wavy line in FIG. 1A indicating the possibility of further structure.

An n-type channel 46 is hosted in the body, or substrate 50, and an NFET gate stack 72 overlaps the n-type channel 46. A NFET gate insulator 22 is in-between the NFET gate stack 72 the and the n-type channel 46.

The NFET gate insulator 22 has two layers: an NFET dielectric layer 30' and an "n" interfacial control layer 20 (NICL). The embodiment depicted in FIG. 1A has the NICL 20 next to an a NFET gate layer 60', and the NFET dielectric layer 30' next to the n-type channel 46. Accordingly, the arrangement of the FIG. 1A embodiment is such that the NICL 20 is in-between the NFET gate layer 60' and the NFET dielectric layer 30', and it is in direct physical contact with both. The NFET dielectric layer 30' may be in direct physical contact with the n-channel 46, or there may be a very thin interlaying film, not shown in FIG. 1A. Such a very thin film may be of oxide, which under fabrication conditions may even be difficult to avoid in the form of a native oxide. However, the presence of, or the lack of, such an additional film between the NFET dielectric layer 30', and the n-channel 46 is of no consequence regarding embodiments of the present invention.

The NICL 20, as known in the art, is an oxide of at least one element selected from the combination of groups IIA and IIIB of the periodic table of the elements. It may be, for instance, $La_2O_3$, MgO, BaO, or others. In exemplary embodiment of the invention the NICL 20 is selected to be lanthanum oxide ($La_2O_3$). In the same manner as discussed in relation to the material of the PICL 10, the composition of the lanthanum oxide in the thin NICL 20 may not have exactly the bulk stoichiometric composition of $La_2O_3$.

Figure 3:
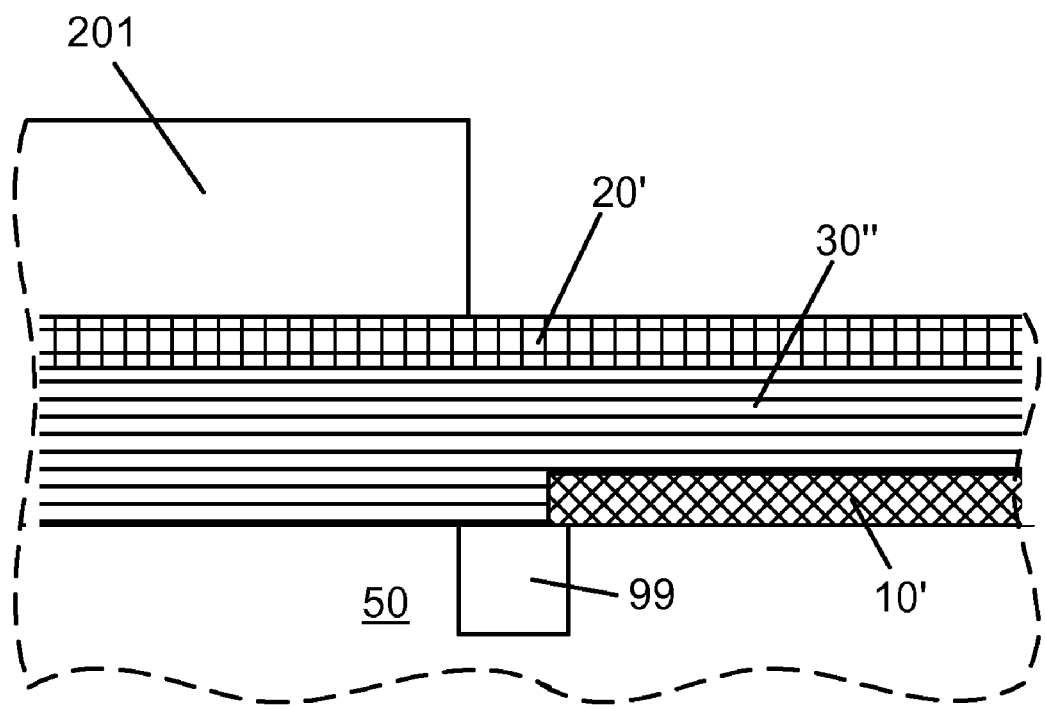
FIG. 3 shows a schematic cross section of a following stage in the processing toward embodiments of the present invention.

The NFET dielectric layer 30' consists of the same high-k insulator material as the PFET dielectric layer 30, as noted with the similar indicator numbers. The PFET dielectric layer 30 and the NFET dielectric layer 30' are patterned out of the same originally blanket deposited high-k insulator material 30" (FIG. 3).

Figure 4:
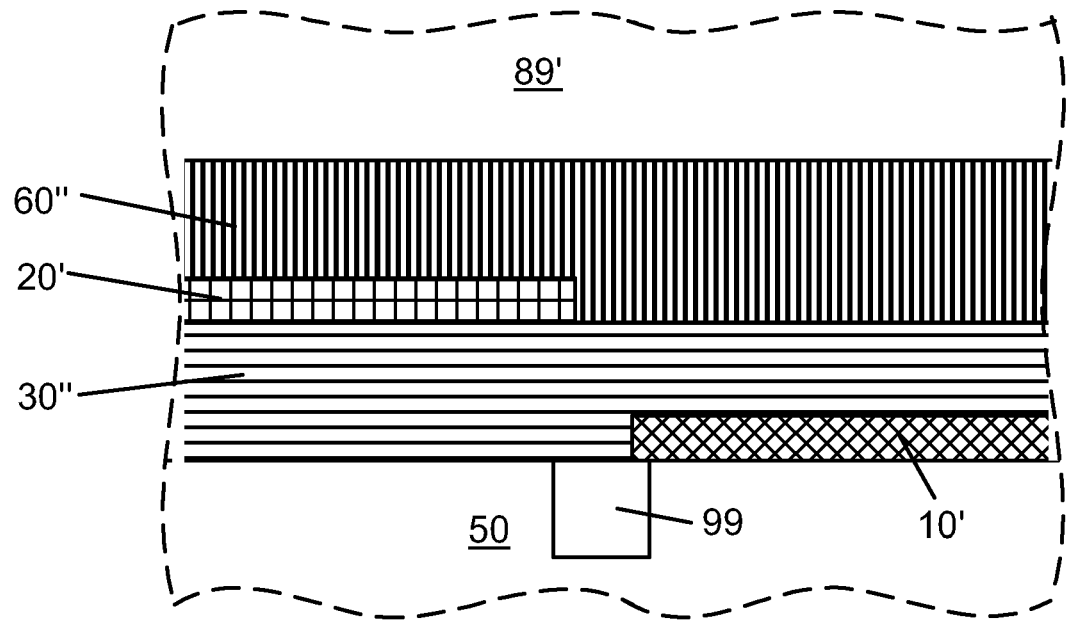
FIG. 4 shows a schematic cross section of a later stage in the processing toward embodiments of the present invention, where the materials for the gate insulator and the gate stack layers have already been disposed.

The NFET gate layer 60' consists of the same gate metal material as the PFET gate layer 60, as noted with the similar indicator numbers. The PFET gate layer 60 and the NFET gate layer 60' are patterned out of the same originally blanket deposited gate metal material 60" (FIG. 4).

The NFET gate layer 60' is part of an NFET gate stack 72. The NFET gate stack 72 may also contain various additional conductive layers 89, similarly as the PFET gate stack 71 does. Similarly, as well, the nature of possible additional layers covering the NFET gate layer 60' are of no particular interest for the embodiments of the present invention, and are lumped together under the single indicator number 89, with the wavy line in FIG. 1A indicating the possibility of further structure.

The CMOS circuit embodiments of the present invention are characterized by the PFET and NFET gate layers 60 and 60' being of the same gate metal material, and furthermore, by the PFET and NFET dielectric layer 30 and 30' being of the same high-k insulator material.

In some CMOS circuit embodiments of the invention, the "n" interfacial control layer 20 may not be present in the NFET gate insulator 22. Such an embodiment may be used, for instance, when such an NFET gate layer 60' is selected such that the NFET device threshold has an acceptable value without the presence of an NICL 20.

Figure 1B:
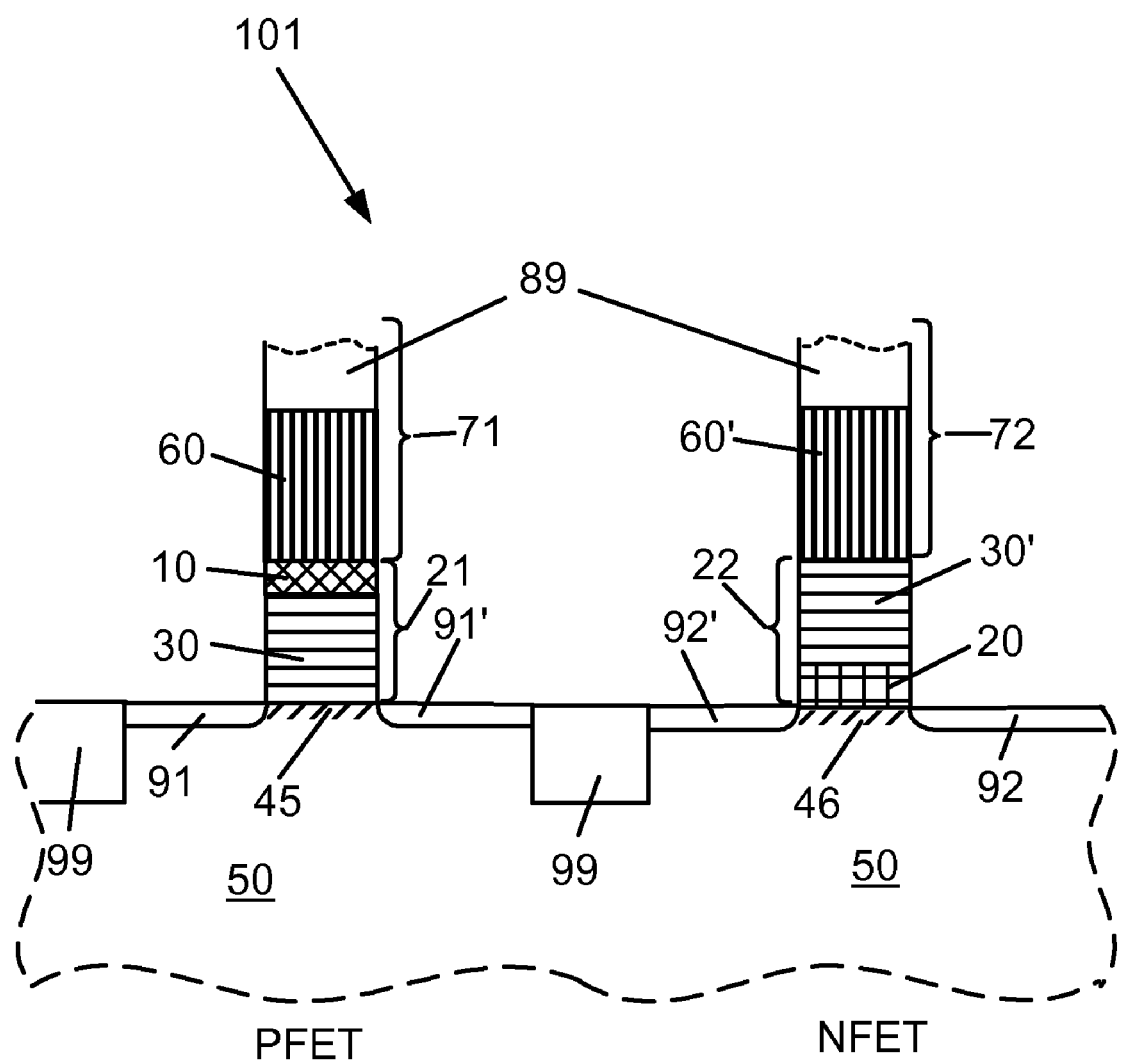
FIG. 1B shows a schematic cross section of a CMOS circuit structure according to an alternate embodiment of the present invention, including interfacial control layers with different positioning.

When both a PICL 10 and NICL 20 are used in the CMOS circuit embodiments of the present invention, as depicted in FIG. 1A and FIG. 1B, there is a defined relationship in the positioning of the two interfacial control layers 10, 20. They are positioned to the opposite sides of their corresponding dielectric layers 30, 30'. If the PICL 10 is in-between the p-channel 45 and the PFET dielectric layer 30, than the NICL 20 is in-between the NFET dielectric layer 30' and the NFET gate layer 60'. Conversely, if the PICL 10 is in-between the PFET dielectric layer 30 and the PFET gate layer 60, then the NICL 20 is in-between the n-channel 46 and the NFET dielectric layer 30'. In typical embodiments of the invention, the PICL 10 and the NICL 20 are consisting of differing materials.

By using the same metal gate material for both of the two type of devices, one has the possibility of increasing circuit density. This may be done by having certain electrodes of the of the two type of devices in direct physical contact, without an isolation structure, such as a shallow trench 99 in-between them. This arrangement is often referred to in the art as the "butting" of junctions, and the result referred to as "butted" junctions. FIG. 1A depicts such an embodiment.

The PFET device has PFET type electrodes 91, 91', including a first electrode 91', and the NFET device has NFET type electrodes 92, 92', including a second electrode 92'. The first electrode 91' and the second electrode 92' are butted against one another in direct physical contact. The dashed line 88 indicates the dividing plane between the NFET and PFET devices. The reason that butting of junctions is possible when a common material if used as the gate metal of the two type of devices, is that in the common metal case one is not forced to use block level masks to protect one type of device when the gate of the other type of device is processed. The alignment of block level masks is not sufficiently accurate to assure device functionality without an isolation structure, such as a shallow trench 99, between different type devices. A more detailed description of the relation between butted electrodes and metal gates fabricated out of a common material can be found in U.S. patent application Ser. No. 11/745,994, filed May 8, 2007, inventors: B. B. Doris et al., which is incorporated herein by reference.

FIG. 1B shows a schematic cross section of a CMOS circuit structure according to an alternate embodiment 101 of the present invention including interfacial control layers with different positioning. This embodiment shows the two type of devices separated by an isolation structure, as an example, a shallow trench 99. Otherwise all features of the embodiment of FIG. 1B are the same as those of FIG. 1A, with the exception that the PICL 10 and the NICL 20 are in an alternate positioning scheme.

The embodiment of FIG. 1B, has again the PFET gate insulator 21 containing the PFET dielectric layer 30 and the PICL 10, however the positioning of the two layers is such that the PICL 10 is in-between the PFET gate layer 60 and the PFET dielectric layer 30, and it is in direct contact with both. While for the NFET device, the NFET dielectric layer 30' is positioned to be in-between the NICL 20 and the NFET gate layer 60', and to be in direct contact with both.

If, for generality, the CMOS circuit structures of FIGS. 1A and 1B are described in terms of a first type of device and a second type of device, then the following is understood. If the first type of device is a PFET, then the second type of device is an NFET. And it follows that the first type channel is a p-type channel, a first gate stack is a PFET gate stack, a first gate layer is a PFET gate layer, a first gate insulator is a PFET gate insulator, a first dielectric layer is a PFET dielectric layer, and the first interfacial control layer consists essentially of aluminum oxide, or aluminum nitride. Correspondingly, the second type channel is an n-type channel, a second gate stack is an NFET gate stack, a second gate layer is an NFET gate layer, a second gate insulator is an NFET gate insulator, a second dielectric layer is an NFET dielectric layer, and a second interfacial control layer consists of an oxide of at least one element selected from the combination of groups IIA and IIIB of the periodic table of the elements, such as lanthanum oxide. It is also understood that in the mirroring case, when the first type of device is an NFET, and the second type of device is a PFET, all "n" and "p" designations are also mirrored, and furthermore, the first interfacial control layer in this case consists of an oxide of at least one element selected from the combination of groups IIA and IIIB of the periodic table of the elements, such as lanthanum oxide, and the second interfacial control layer consists essentially of aluminum oxide, or aluminum nitride.

Figure 2:
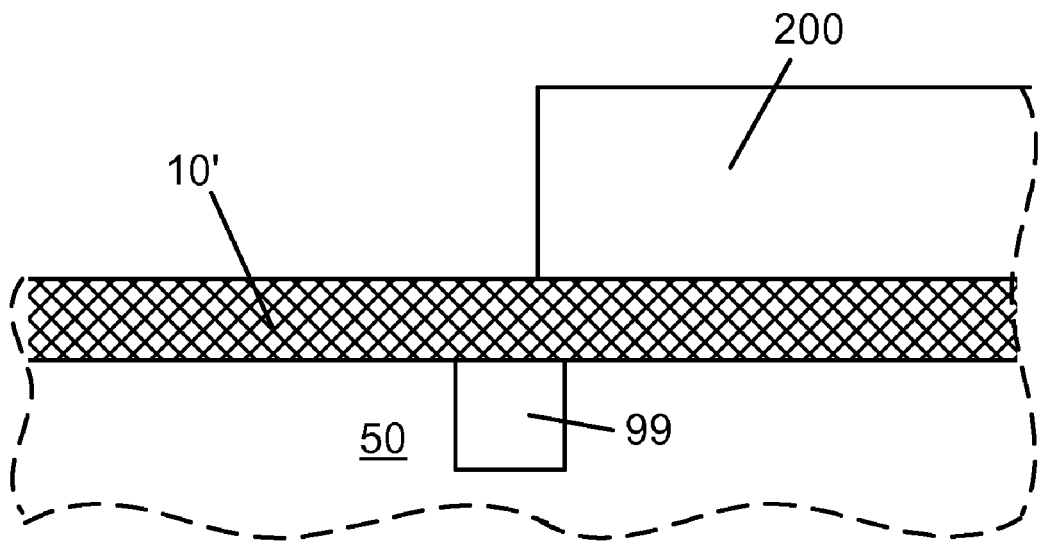
FIG. 2 shows a schematic cross section of an early state of the processing toward embodiments of the present invention.

FIGS. 2 to 5 depict processes that yield that CMOS circuit structure embodiment which is depicted on FIG. 1A, with the exception that the junctions are not butted, instead showing an isolation structure 99. FIG. 2 shows a schematic cross section of an early state of the processing toward embodiments of the present invention.

Manufacturing of NFET, PFET, and CMOS is very well established in the art. It is understood that there are a large number of steps involved in such processing, and each step might have practically endless variations known to those skilled in the art. It is further understood that the whole range of known processing techniques are available for fabricating the disclosed device structures, and only those process steps will be detailed that are of interest for embodiments of the present invention.

A blanket layer 10' of aluminum oxide, or possibly aluminum nitride, is disposed over the body 50. The layer of aluminum oxide 10' is less than about 1.5 nm thick, typically in the range of between about 0.1 nm and about 1 nm. Such a disposition may proceed by method known in the art, for instance by atomic layer deposition (ALD), chemical vapor deposition (CVD), physical vapor deposition (PVD), and others. This layer 10' of aluminum oxide, or aluminum nitride, is the one from which at a later stage of processing the PICL 10 will be patterned. A block mask 200 is disposed over areas of the circuit which will contain PFET devices, and the layer of aluminum oxide 10' will be removed from regions outside the mask 200.

FIG. 3 shows a schematic cross section of a following stage in the processing toward embodiments of the present invention. A blanket layer of a high-k dielectric 30" has been disposed over both type of device areas. This layer of high-k dielectric 30" is the one from which at a later stage of processing both the PFET and NFET dielectric layers 30 and 30' will be patterned. This layer of a high-k dielectric 30" in typical embodiments of the invention is $HfO_2$, disposed by methods known in the art. Over the layer of a high-k dielectric 30" a blanket layer 20' of an oxide of at least one element selected from the combination of groups IIA and IIIB of the periodic table of the elements, such as lanthanum oxide, has also been disposed, again by methods known in the art. This layer 20' of oxide, typically lanthanum oxide, is the one from which at a later stage of processing the NICL 20 will be patterned. Another block mask 201 is disposed over areas of the circuit which will contain NFET devices, and the layer 20' of an oxide, such as lanthanum oxide, will be removed from regions outside the mask 201.

If a variant embodiment of the invention is desired, where the PICL and NICL are alternately positioned, clearly, the order of disposing the layer 10' of aluminum oxide, or aluminum nitride, and the layer 20' of an oxide of at least one element selected from the combination of groups IIA and IIIB of the periodic table of the elements, would be reversed. The layer of aluminum oxide 10' would be over the layer of a high-k dielectric 30". If one is dealing with an embodiment where there is no need for NICL, the layer 20' such as lanthanum oxide, would be omitted, and the layer 10' of aluminum oxide, or aluminum nitride, could be selected to be disposed under, or over, the layer of a high-k dielectric 30".

FIG. 4 shows a schematic cross section of a later stage in the processing toward embodiments of the present invention, where the materials for gate insulator and gate stack layers have been disposed. A layer of the gate metal material 60" is blanket disposed over the regions of both type of devices. This layer of the gate metal material 60" is the one from which at a later stage of processing both the PFET and NFET gate layers 60 and 60' will be patterned. In representative embodiments of the invention the layer of the gate metal material 60" is TiN. An additional layer 89, or layers, as known in the art, may now be disposed over the layer of the gate metal material 60".

Figure 5:
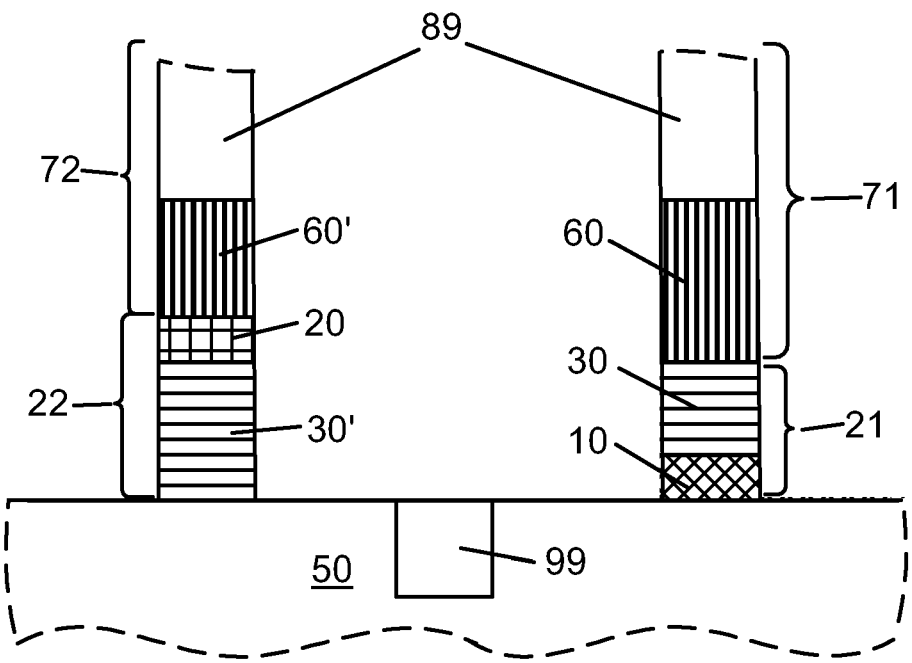
FIG. 5 shows a schematic cross section of a stage in the process after gate insulator and gate stack patterning.

FIG. 5 shows a schematic cross section of a stage in the process after gate insulator and gate stack patterning. Following all the layer depositions, the gate stacks 71, 72 and gate insulators 21, 22 are concomitantly patterned. Such patterning may follow processes known in the art. From here on, completion of the devices, and connecting the devices into CMOS configurations may also be done with fabrication steps known in the art.

Figure 6:
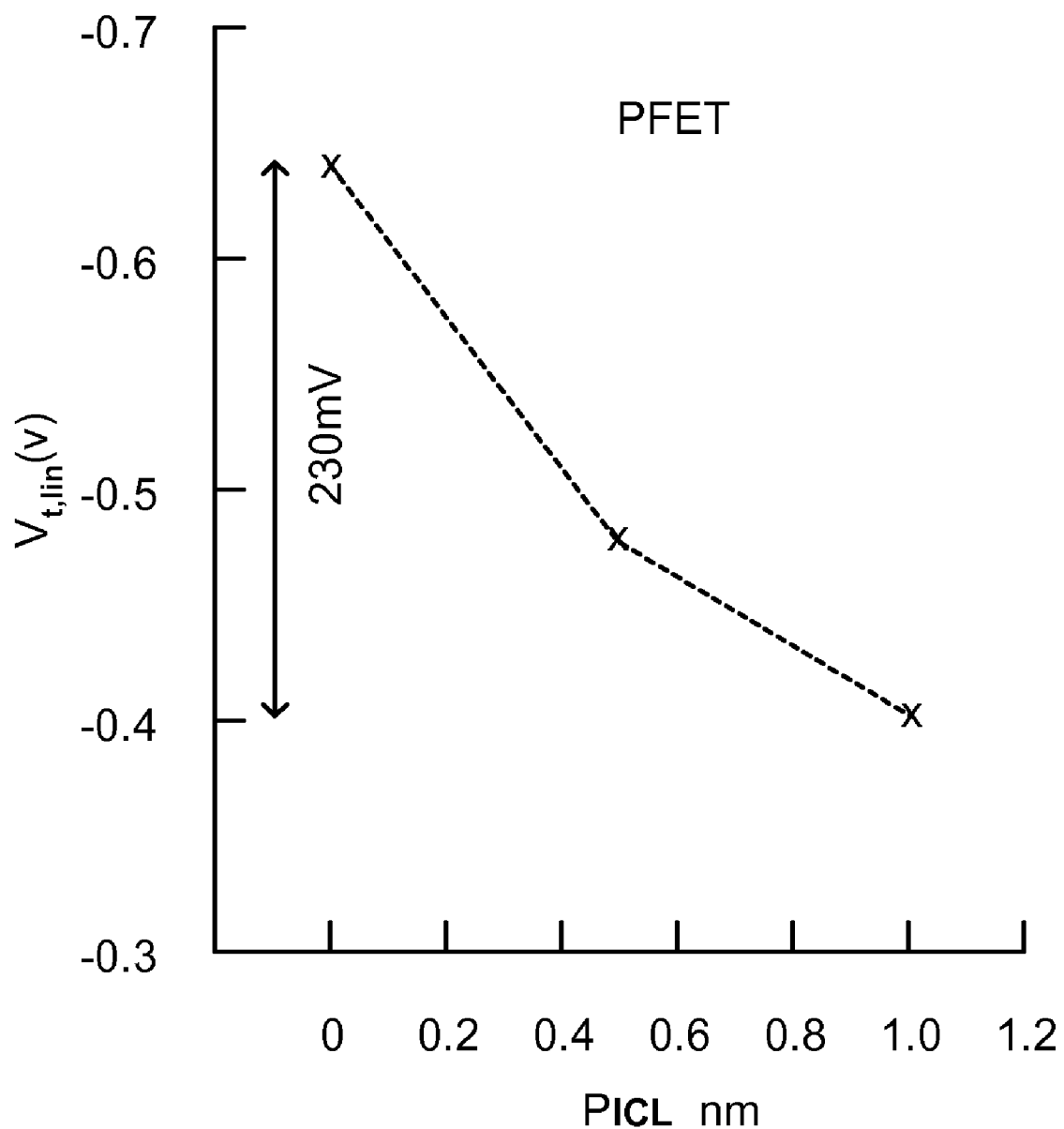
FIG. 6 shows PFET threshold behavior as function of interfacial control layer thickness.

FIG. 6 shows PFET threshold behavior as function of interfacial control layer thickness. The depicted behavior was experimentally observed on a PFET device where the PICL, an aluminum oxide layer, was deposited first, and followed by high-k dielectric and gate metal layers. The high-k dielectric material was $HfO_2$, and the gate metal material was TiN. As the figures shows $V_{t,lin}$, the device threshold in the linear operation mode (with a small applied drain voltage), moves 230 mV in the "p" direction as the aluminum oxide PICL thickness increases to 1 nm. The threshold move is in the positive voltage direction, since, although $V_{t,lin}$ remained of a negative value, it shifted to a smaller negative value.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as "under," "top", "side," "on", etc., as used herein refer to relative location and orientation of various portions of the structures with respect to one another, and are not intended to suggest that any particular absolute orientation with respect to external objects is necessary or required.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art. The scope of the invention is defined by the appended claims.

We claim:

1. A method for fabricating a CMOS circuit, comprising:
PFET and NFET devices, wherein said PFET and NFET devices are both characterized as being metal gate devices with high-k gate insulators;
blanket disposing over a PFET region and a NFET region a high-k insulator material;
blanket disposing over said high-k insulator material a gate metal material;
concomitantly patterning a PFET gate layer and a NFET gate layer and a PFET gate dielectric layer a NFET gate dielectric layer out of said gate metal material and said high-k insulator material;
in said PFET device, forming a first interfacial control layer in such manner to have said PFET gate dielectric layer in-between and in direct contact with said first interfacial control layer and said PFET gate layer, wherein selecting said first interfacial control layer to be between about 0.1 nm and about 1 nm thick and to consist essentially of aluminum oxide; and
in said NFET device, forming a second interfacial control layer in such manner to have said second interfacial control layer in-between and in direct contact with said NFET gate dielectric layer and said NFET gate layer, wherein selecting said second interfacial control layer to be an oxide of at least one element selected from the combination of groups IIA and IIIB.

2. The method of claim 1, further comprising:
in said PFET device, implementing PFET electrodes, including a first electrode, wherein said PFET electrodes adjoin a PFET channel and are capable of being in electrical continuity with said PFET channel;
in said NFET device, implementing NFET electrodes, including a second electrode, wherein said NFET electrodes adjoin a NFET channel and are capable of being in electrical continuity with said NFET channel; and
butting in direct physical contact said first electrode and said second electrode.

3. A method for fabricating a CMOS circuit, comprising:
NFET and PFET devices, wherein said NFET and PFET devices are both characterized as being metal gate devices with high-k gate insulators;
blanket disposing over a NFET region and a PFET region a high-k insulator material;
blanket disposing over said high-k insulator material a gate metal material;
concomitantly patterning an NFET gate layer and a PFET gate layer and an NFET gate dielectric layer and a PFET gate dielectric layer out of said gate metal material and said high-k insulator material, wherein said PFET gate dielectric layer is in direct physical contact with said PFET gate layer; and
in said PFET device, forming an aluminum oxide layer in such manner as to have said PFET gate dielectric layer in direct contact with said aluminum oxide layer, and selecting said aluminum oxide layer to be between about 0.1 nm and about 1 nm thick.

4. The method of claim 3, further comprising:
in said NFET device, implementing NFET electrodes, including a first electrode, wherein said NFET electrodes adjoin a NFET channel and are capable of being in electrical continuity with said NFET channel;
in said PFET device, implementing PFET electrodes, including a second electrode, wherein said PFET electrodes adjoin a PFET channel and are capable of being in electrical continuity with said PFET channel; and butting in direct physical contact said first electrode and said second electrode.

5. A method for fabricating a CMOS circuit, comprising:

first type and second type devices, wherein said first type and second type devices are both characterized as being metal gate devices with high-k gate insulators;

blanket disposing over a first region and a second region a high-k insulator material;

blanket disposing over said high-k insulator material a gate metal material;

concomitantly patterning a first gate layer and a second gate layer and a first gate dielectric layer a second gate dielectric layer out of said gate metal material and said high-k insulator material;

in said first type device, forming a first interfacial control layer in such manner to have said first gate dielectric layer in-between and in direct contact with said first interfacial control layer and said first gate layer, and wherein said first interfacial control layer is absent in said second type device;

in said second type device, forming a second interfacial control layer in such manner to have said second interfacial control layer in-between and in direct contact with said second gate dielectric layer and said second gate layer, and wherein said second interfacial control layer is absent in said first type device; and selecting differing materials for forming said first interfacial control layer and for forming said second interfacial control layer.

6. The method of claim 5, further comprising:

selecting said first type device to be an NFET device, and selecting said first interfacial control layer to be an oxide of at least one element selected from the combination of groups IIA and IIIB; and selecting said second type device to be a PFET device.

7. The method of claim 5, further comprising:

selecting said first type device to be a PFET device, and selecting said first interfacial control layer to consist essentially of aluminum oxide; and selecting said second type device to be an NFET device.

\* \* \* \* \*